(12) United States Patent
Scherer et al.

(10) Patent No.: US 8,212,217 B2
(45) Date of Patent: Jul. 3, 2012

(54) SILICON SURFACE STATE DETECTORS AND DETECTOR ARRAYS

(75) Inventors: Axel Scherer, Laguna Beach, CA (US);
Michael D. Henry, Altadena, CA (US);
Harold Hager, Bellevue, WA (US)

(73) Assignees: Boeing Company, Chicago, IL (US);
California Institute of Technology, Pasadena, CA (US)

( * ) Notice: Subject to any disclaimer, the term of this patent is extended or adjusted under 35 U.S.C. 154(b) by 491 days.

(21) Appl. No.: 12/572,234

(22) Filed: Oct. 1, 2009

(65) Prior Publication Data
US 2010/0155602 A1 Jun. 24, 2010

Related U.S. Application Data

(60) Provisional application No. 61/194,968, filed on Oct. 2, 2008.

(51) Int. Cl.
*G01T 1/24* (2006.01)

(52) U.S. Cl. ........... 250/370.01; 250/338.4; 250/339.02; 250/372

(58) Field of Classification Search ............... 250/336.1, 250/338.1, 338.4, 339.02, 370.01, 372
See application file for complete search history.

(56) References Cited

U.S. PATENT DOCUMENTS
2006/0273421 A1* 12/2006 Yasuoka et al. ............... 257/438

OTHER PUBLICATIONS

Baehr-Jones, T., et al. Photodetection in silicon beyond the band edge with surface states. Optics Express, vol. 16, No. 3, pp. 1659-1668, Feb. 4, 2008.

* cited by examiner

*Primary Examiner* — Mark R Gaworecki
(74) *Attorney, Agent, or Firm* — Steinfl & Bruno, LLP

(57) ABSTRACT

Photodetection devices and methods are described. The photodetection devices comprise semiconductor tapered pillars.

39 Claims, 4 Drawing Sheets

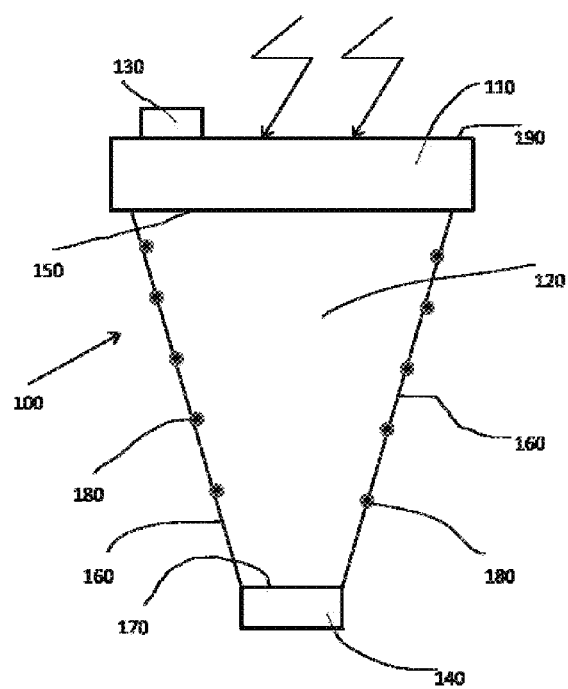
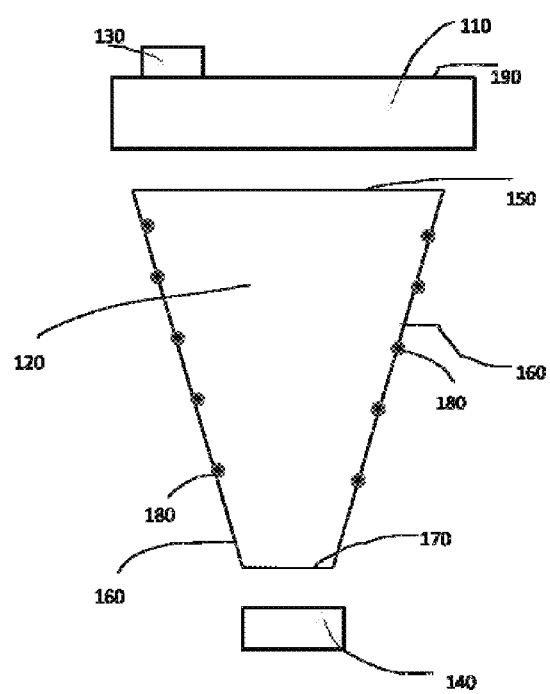
FIG. 1A                    FIG. 1B

SILICON SURFACE STATE DETECTORS AND DETECTOR ARRAYS

CROSS REFERENCE TO RELATED APPLICATIONS

The present application claims priority to U.S. Prov. App. No. 61/194,968 filed on Oct. 2, 2008, which is incorporated herein by reference in its entirety.

STATEMENT OF GOVERNMENT GRANT

The U.S. Government has certain rights in this invention pursuant to Grant No. HR0011-04-1-0054 awarded by DARPA.

FIELD

The present disclosure relates to photodetectors. More in particular, it relates to a silicon surface state detectors, detector arrays and related method.

BACKGROUND

Detection of infrared light by normal incidence detection typically uses semiconductor p-n junctions or conductors in which light generates carriers within the bulk of the semiconductor that is irradiated. In such detectors, carriers (electrons and holes) are generated if an incident photon has a higher energy than the band-gap, and is absorbed within the semiconductor to contribute to an overall detector current. This approach limits the use of detectors to energies above their bandgap, and, in the case of silicon, this limits an efficient detection of light to above approximately 1.1 eV.

As a result of this limitation, silicon PIN and photodetectors are typically used in visible and NIR wavelength ranges. For longer wavelengths, other materials such as InGaAs or Ge have to be employed, and this typically results in complex materials systems that have to be grown or waferbonded together resulting in infrared detector arrays that are not cost effective

SUMMARY

According to a first aspect, a photodetector device is provided comprising: an anisotropic tapered semiconductor pillar having side walls, a top side and a bottom side, the topside adiabatically tapered down to the bottom side, a first metal contact connected with the top side, and a second metal contact connected with the bottom side.

According to a second aspect, a a photodetector device is provided comprising: a first semiconductor wafer having a first side and a second side, a first metal contact on the first side, a tapered anisotropic semiconductor pillar having side walls, a top side and a bottom side, the top side adiabatically tapered down to the bottom side, a second metal contact connected with the bottom side of the anisotropic semiconductor pillar and a semiconductor wafer connected to the second metal contact.

According to a third aspect, a method for detecting light provided comprising: providing a semiconductor pillar having a first side, a second side and side walls, inputting light into the semiconductor pillar through the first side, the side walls being configured so that light experiences an increasing number of reflections per unit length of axis of propagation while propagating from the first side of the semiconductor pillar to the second side of the semiconductor pillar, whereby surface state of the side walls are excited through interaction of the reflected light with the surface states and photons are absorbed by the excited surface states thereby providing carriers and providing photo-current by applying a voltage difference between the first side of the semiconductor pillar and the second side of the semiconductor pillar.

According to a fourth aspect, a a photodetector array is provided comprising: a first semiconductor wafer having a first side and a second side and a metal contact on the first side of the first semiconductor wafer, two or more anisotropic tapered pillars each having side walls, a top side and a bottom side, the top side tapered down to the bottom side, two ore more respective second metal contacts each connected with the bottom side of a respective anisotropic tapered semiconductor pillar, and a second semiconductor chip having a third side connected with at least two of the two or more second metal contacts.

According to a fifth aspect, a method for detecting light provided comprising: providing a semiconductor pillar having a first side, a second side and side walls, inputting light into the semiconductor pillar through the first side, the side walls being configured so that the light input to the semiconductor pillar is guided from the first side of the semiconductor pillar to the second side of the semiconductor pillar, whereby surface states of the side walls are excited through interaction of the reflected light with the surface states and photons are abosorbed by the excited surface states thereby providing carriers and generating photo-current by applying a voltage difference to the first side of the semiconductor pillar and the second side of the semiconductor pillar.

Further aspects of the present disclosure are shown in the descriptions, drawings and claims of the present application.

BRIEF DESCRIPTION OF THE DRAWINGS

FIG. 1A shows a cross sectional view of a silicon photodetector according to an embodiment of the disclosure.

FIG. 1B shows a cross sectional view of the silicon photodetector shown in FIG. 1A where for the sake of clarity the elements are shown in an exploded manner.

DETAILED DESCRIPTION

Figure 2:
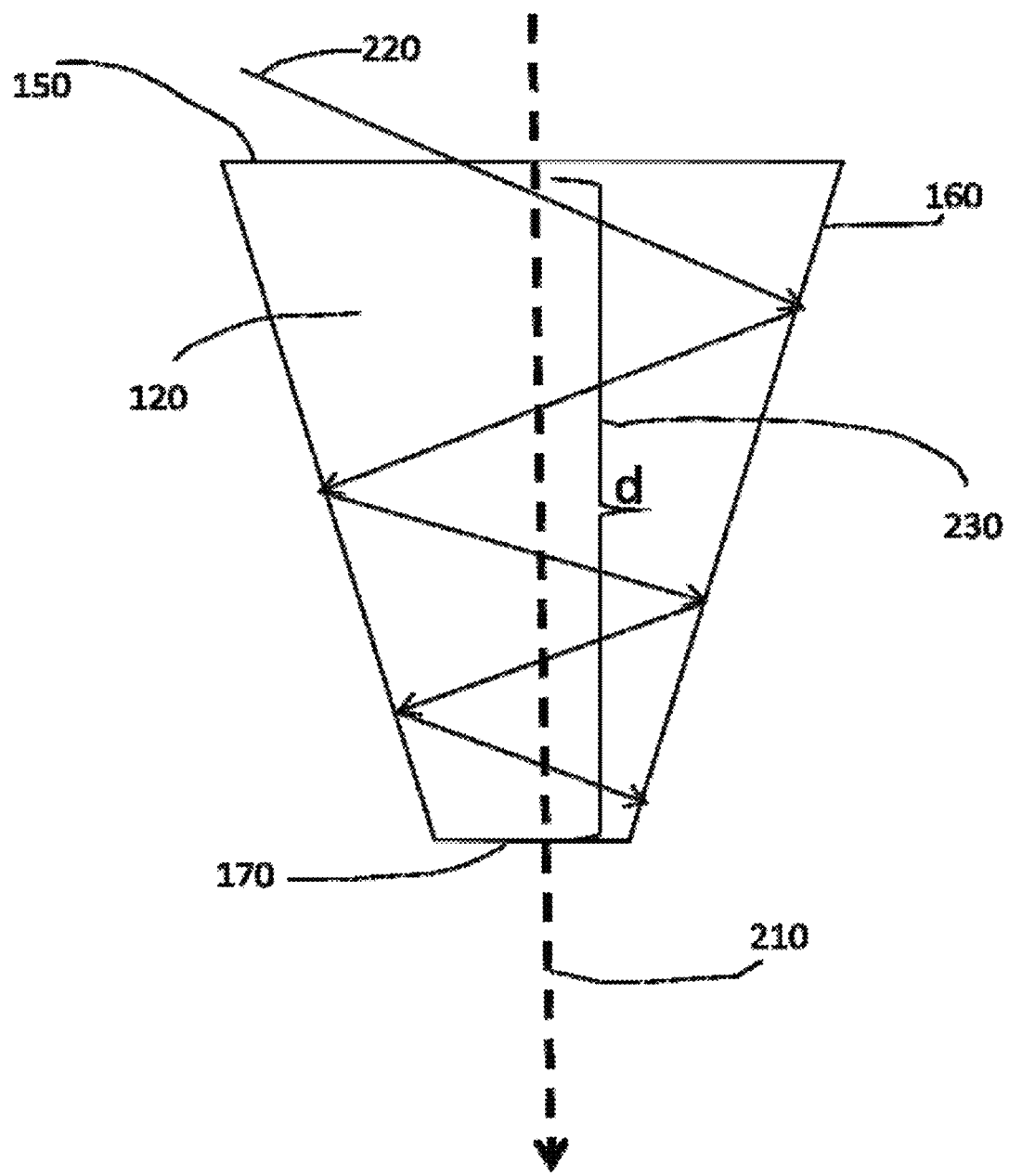
FIG. 2 shows a cross sectional view of a tapered silicon pillar, an incident ray of light and its propagation path and a vertical axis of propagation.

Photodetection methods and devices described in embodiments of the present disclosure rely on excitation of surface states that can absorb photons and therefore generate carriers that will provide photo-current. In particular, photons with lower-energies than bandgap of materials used to fabricate the devices can be absorbed. As a result, detection of broader target wavelengths is enabled. Embodiments of the present disclosure also describe device geometries allowing improved efficiency of the described devices FIG. 1A shows a cross sectional view of a photodetector (100) in accordance with an embodiment of the disclosure. The photodetector comprises a silicon wafer (110), a silicon pillar (120), a first metal contact (130) and a second metal contact (140). For the sake of clarity, the elements (110, 120, 130, 140) of the photodetector are also shown in an exploded manner in FIG. 1B. The silicon wafer comprises a first side (190). The metal contact (130) is connected to the first side (190) of the silicon wafer (110). The silicon pillar (120) comprises a top side (150), a bottom side (170) and side walls (160), the side walls comprising surface states (180). The side walls (160) are tapered down from the top side (150) to the bottom side (170). The bottom side (170) is connected to a second metal contact (140).

According to an embodiment of the disclosure, during operation, the photodetector (100) is illuminated on the first side (190) of the silicon wafer (110) and light is propagated through the pillar (120) experiencing multiple reflections from the side walls (160) and exciting the surface states (180) of the side walls (160). The excited surface states (180) absorb photons thereby generating carriers in the pillar (120). By applying a voltage difference between the first metal contact (130) and the second metal contact (140), photo-current is generated.

According to an embodiment of the disclosure, the photodetector (100) efficiency depends on the number of surface states (180) excited by photons interacting with the surfaces states (180). In other words, the silicon pillar (120) geometry is defined in a way to increase interaction length of photons with the surface states (180) as described later.

FIG. 2 shows a cross sectional view of the silicon pillar (120). An incident ray of light (220) is shown in FIG. 2. The incident ray (220) is captured through the first side (150) of the silicon pillar (120) and experiences multiple reflections from the side walls (160) while propagating downward through the pillar (120). A vertical axis of propagation (210) is also shown in FIG. 2. In the embodiment of FIG. 2, the vertical axis of propagation (210) is perpendicular to the first side (150) and to the second side (170) and its direction is downward. Referring to FIG. 2, it is noted that tapering down from the first side (150) to the second side (170) is performed over a vertical distance d (230). The vertical distance d (230) is measured along the vertical axis of propagation (210).

According to an embodiment of the disclosure, the pillar (120) is adiabatically tapered meaning that tapering transition is continuous and that the vertical distance d (230) is over two orders of magnitude longer than wavelength of the photons propagating in the pillar (120).

Referring to FIG. 2, as a result of adiabatically tapering the side walls (160), the number of reflections from the side walls (160) per unit length, measured along the vertical axis of propagation (210), is increased. In other words, as light propagates downward in the pillar (120), a larger number of surface states (180) are excited and therefore, the photodetector (100) efficiency is improved. Moreover, adiabatically tapering the side walls (160) further enhances the photodetector efficiency by reducing the number of back-reflections that light experiences from the side walls (160) while traveling inside the pillar (120).

According to an embodiment of the disclosure, the silicon pillar (120) is anisotropic, i.e., it exhibits properties with different dimensions when measured in different directions. As a result, interaction length between photons and the surface states (180) is increased and therefore, the photo-detector (100) efficiency is further enhanced.

In another embodiment of the disclosure, during operation, the silicon pillar (120) has a smaller width (i.e., distance between the walls) than wavelength of an incident light. In such case, the incident light is guided through the silicon pillar (120), exciting the surface states (180). The excited surface states (180) absorb photons thereby generating carriers in the pillar (120). By applying a voltage difference between the first metal contact (130) and the second metal contact (140), photo-current is generated.

According to an embodiment of the disclosure, the silicon pillar's (120) cross section can have an arbitrary shape, for example circular or squared.

The person skilled in the art will note that in the photodetector according to the present disclosure, light is received from the widest side of the photodetector (100) allowing a larger number of photons to be collected. As a result, the photodetector coupling efficiency is improved. Secondly, for a given target wavelength range, the pillar (120) does not have to be as precisely fabricated as in the case of a non-tapered waveguide photodetector where accurate mode-matching with received light is a hard requirement. In other words, the tapered photodetector (100) according to the present disclosure will enable addressing of broader target wavelength ranges using a more relaxed fabrication accuracy requirement. Furthermore, the photodetector (100) does not need an additional component (for example a Grating Coupler) to collect and direct light into waveguide. Given its tapered shape, the photodetector (100) collects light through its wider side, in other words the top side (150) without requiring any additional component as coupling element.

Referring to FIG. 1A-B, according to an embodiment of the disclosure, a mirror can be used on the bottom side (170) of the silicon pillar (120). Light hitting the bottom side (170) will be back-reflected and as a result, the interaction length of photons and surface states will increase and therefore detection efficiency will improve. The mirror can be provided as an additional component (not shown) or the upper surface of the second metal contact (140) can act as a mirror.

The person skilled in the art will understand, upon reading of the present disclosure, that various alternatives can be provided to the embodiment of FIG. 1A. Other semiconductor materials (for example Ge, InP, GaN, GaP, InAs and GaAs) having surface states can be used instead of silicon to fabricate the elements (110, 120). It is understood that the elements (110, 120) are made of same material and the choice of material depends on a targeted operating wavelength range.

According to an embodiment of the disclosure, the photodetector (100) can detect a wide wavelength range from ultraviolet to infrared, in particular near infrared and near infrared to mid infrared. The person skilled in the art will appreciate that the photodetector (100) can detect photons having wavelengths corresponding to a bandgap energy smaller that that of the material used to fabricate the element (120). For example, referring to FIG. 1A where the elements (110, 120) are made of silicon, wavelengths corresponding to bandgap energy less than 1.2 eV (i.e., wavelengths larger than 1 um) which is the silicon bandgap energy, can be detected.

Figure 3:
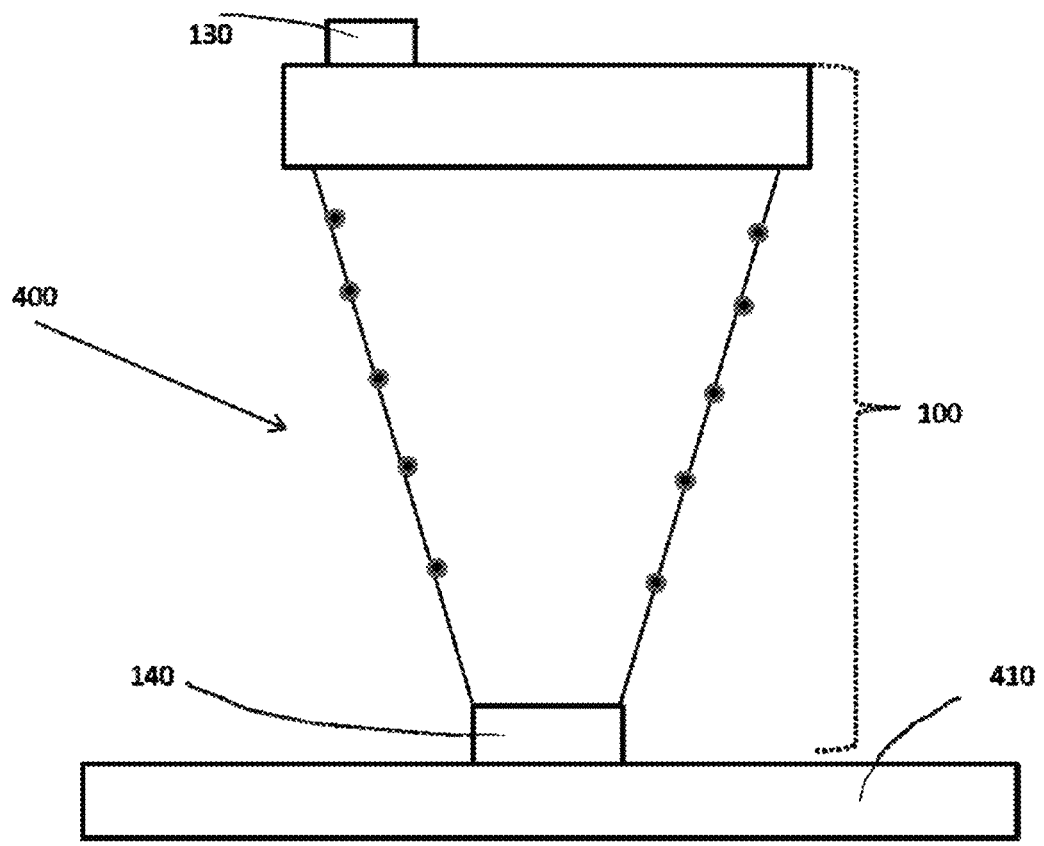
FIG. 3 shows a cross sectional view of a silicon photodetector.

FIG. 3 shows a photodetector (400) in accordance with an embodiment of the disclosure. The photodetector (400) comprises the photodetector (100) discussed in the previous figures and a silicon chip (410). The silicon chip (410) is connected to the second metal contact (140). Photo-current is generated in the same way as described for the photodetector (100) except that bias voltage is applied between the first metal contact (130) and the silicon chip (410).

According to an embodiment of the disclosure, the silicon chip (410) comprises electronic circuits. The person skilled in the art will understand that the electronic circuits can be used for various purposes. For example, the electronic circuits can be used to measure the generated photocurrent or other purposes such as current to voltage conversion etc. In another embodiment of the disclosure, the silicon wafer (110) is anti-reflection coated.

According to yet another an embodiment of the disclosure, when a high voltage (i.e., 20-30 volts) is applied between the first metal contact (130) and the silicon chip (410), a generated photo-current is amplified by way an avalanche effect. The avalanche effect is similar to the one found in avalanche photodiodes. Photo-generated electrons can generate additional electrons while propagating down the pillar (120) towards the silicon chip (410) and as a result, photodetection efficiency is further improved.

A plurality of the photodetectors (100) can be integrated into an array by using well known fabrication systems to provide photodetector arrays. In what follows, such photodetector arrays are described.

Figure 4:
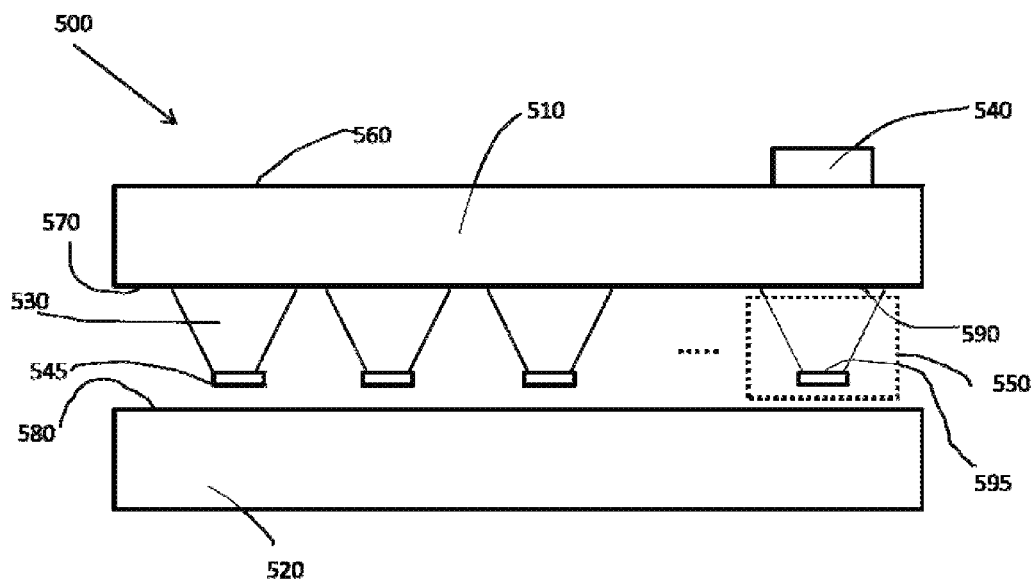
FIG. 4 shows a cross sectional view of a silicon photodetector array.

FIG. 4 shows a photodetector array (500) in accordance with an embodiment of the disclosure. The photodetector array comprises a first silicon chip (510), a second silicon chip (520), a ground metal contact (540) and an array of detection elements (550) where each detection element (550) comprises a silicon pillar (530) and a metal contact (545). Each silicon pillar (530) has a wide side (590) and a narrow side (595). The first silicon chip (510) has a contact side (560) and a pillar side (570). The wide side (590) of each single silicon pillar (530) is connected to the pillar side (570) of the first silicon chip (510). The narrow side (595) of each silicon pillar (530) is connected to the metal contact (545).

The second silicon chip (520) has a pillar side (580). The ground metal contact (540) is connected to the contact side (560). The metal contact (545) of detection element (550) is connected to the pillar side (580) of the second silicon chip (520).

In the embodiment of FIG. 4, the photo-detector array is illuminated from the contact side (560) of the first silicon chip (510) and light propagates inside each of the silicon pillars (530). Photo-current is generated according the same mechanism as described above in reference to FIG. 1A. Voltage bias is applied between the first silicon chip (510) and the second silicon chip (520).

According to an embodiment of the disclosure, the photo-detector array (500) can detect a wide wavelength range from ultraviolet to infrared, in particular near infrared and near to mid infrared. The person skilled in the art will appreciate that the photodetector array (500) can detect photons having wavelengths corresponding to a bandgap energy smaller than that of the material used to fabricate the element (510, 530). For example, if the elements (510, 530) are made of silicon, wavelengths corresponding to bandgap energy less than 1.2 eV (i.e., wavelengths larger than 1 um) which is the silicon bandgap energy, can be detected.

According to an embodiment of the disclosure, the first silicon chip (510) is lightly doped (e.g., n- of p-) so that current flowing inside the photodetector array (500) is negligible compared to the typical photocurrent generated when the photodetector array (500) is illuminated.

According to an embodiment of the disclosure, the photo-detector array (500) can be fabricated with relatively simple processing steps, for example optical lithography followed by anisotropic dry etching.

It is understood that photodetector arrays described in the disclosure can be used for a variety of purposes, for example imaging applications. Such photodetector arrays can be used and are compatible with existing packaged electronic driver circuits.

According to an embodiment of the disclosure, the second silicon chip (520) comprises electronic circuits. The person skilled in the art will understand that the electronic circuits can be used for various purposes. For examples, the electronic circuits can be used to measure the generated photocurrent from the detectors or process the generated photo-currents in the case of imaging applications.

In another embodiment of the disclosure, the second silicon chip (520) is bump-bonded where bump-bonding is used to attach the array of detection elements (550) to the second silicon chip.

In a further embodiment of the disclosure, the silicon chip (510) is anti-reflection coated.

The person skilled in the art will understand, upon reading of the present disclosure that various alternatives can be provided to the embodiment of FIG. 4. Other semiconductor materials (for example Ge, InP, GaN, GaP, InAs or GaAs) having surface states can be used instead of silicon to provide the elements (510, 530). It is understood that the elements (510, 530) are made of same material and the choice of material depends on a targeted operating wavelength range. The person skilled in the art will understand that the element (520) can be made of a material different than that used to fabricate elements (510, 530).

The present disclosure has shown single photodetection and array of photodetection devices and related methods. While the surface state silicon photodetectors, detector arrays and related methods have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

The invention claimed is:

1. A photodetector device comprising:
   an anisotropic tapered semiconductor pillar having side walls, a top side and a bottom side; the top side adiabatically tapered down to the bottom side;
   a first metal contact connected with the top side; and
   a second metal contact connected with the bottom side.

2. The photodetector device of claim 1, wherein
   the top side is adapted to receive light in an operative condition of the photodetector device;
   the received light propagates through the anisotropic tapered semiconductor pillar experiencing multiple reflections from the side walls and exciting surface states of the side walls;
   the excited surface states absorb photons thereby generating carriers in the anisotropic tapered semiconductor pillar; and
   photo-current is detected by applying voltage between the first metal contact and the second metal contact.

3. The photodetector device of claim 2, wherein the excited surface states absorb photons having wavelengths ranging from ultraviolet to infrared.

4. The photodetector device of claim 2, wherein the excited surface states absorb photons having wavelengths ranging from near infrared to mid infrared.

5. The photodetector device of claim 2, wherein the excited surface states absorb photons having near infrared wavelengths.

6. The photodetector device of claim 1, further comprising a minor connected with the bottom side of the anisotropic tapered semiconductor pillar.

7. The photodetector device of claim 1, wherein the anisotropic tapered semiconductor pillar is made of Silicon (Si), Germanium (Ge), InP, GaP, InAs, GaN, or Gallium Arsenide (GaAs).

8. A photodetector device comprising:
   a first semiconductor wafer having a first side and a second side;
   a first metal contact on the first side;

a tapered anisotropic semiconductor pillar having side walls, a top side and a bottom side, the top side adiabatically tapered down to the bottom side;

a second metal contact connected with the bottom side of the anisotropic semiconductor pillar; and a second semiconductor wafer having a third side connected to the second metal contact.

9. The photodetector device of claim 8, wherein the first side of the first semiconductor wafer is adapted to receive light in an operative condition of the photodetector device;

the received light propagates through the anisotropic tapered semiconductor pillar experiencing multiple reflections from the side walls and exciting surface states of the side walls; and the excited surface states absorb photons generating carriers in the anisotropic tapered semiconductor pillar; and photo-current is detected by applying voltage between the first metal contact and the second semiconductor wafer.

10. The photodetector device of claim 9, wherein the excited surface states absorbs photons having wavelengths ranging from ultraviolet to infrared.

11. The photodetector device of claim 9, wherein the excited surface states absorb photons having near infrared wavelengths.

12. The photodetector device of claim 8, wherein the second semiconductor wafer is bump-bonded to the second metal contact.

13. The photodetector device of claim 8, wherein the second semiconductor wafer comprises electronic circuits.

14. The photodetector device of claim 8, wherein the first semiconductor wafer comprises a region having N-type dopant or P-type dopant.

15. The photodetector device of claim 8 wherein the first semiconductor wafer is made of Si, Ge, InP, GaN, GaP, InAs, or GaAs and the second semiconductor wafer is made of Si, Ge, InP, GaN, GaP, InAs, or GaAs.

16. The photodetector device of claim 8, wherein the first semiconductor wafer is anti-reflection coated.

17. The photodetector device of claim 8 wherein the tapered anisotropic semiconductor pillar is made of Si, Ge, InP, GaP, InAs, GaN, or GaAs.

18. A method for detecting light comprising:

providing a semiconductor pillar having a first side, a second side and side walls;

inputting light into the semiconductor pillar through the first side;

the side walls being configured so that the light input to the semiconductor pillar experiences an increasing number of reflections per unit length of axis of propagation while propagating from the first side of the semiconductor pillar to the second side of the semiconductor pillar, whereby surface states of the side walls are excited through interaction of reflected light with the surface states and photons are absorbed by excited surface states thereby providing carriers; and generating photo-current by applying a voltage difference to the first side of the semiconductor pillar and the second side of the semiconductor pillar.

19. The method of claim 18, wherein the side walls of the semiconductor pillar taper down continuously from the first side to the second side.

20. The method of claim 18, wherein the distance between the first side and the second side is over two orders of magnitude longer than the wavelength of absorbed photons.

21. The method of claim 18, further comprising:
connecting a metal contact to the second side of the semiconductor pillar.

22. The method of claim 21, further comprising:
self-aligning of the semiconductor pillar by way of the metal contact.

23. The method of claim 18, wherein the first side is anti-reflection coated.

24. The method of claim 18, further comprising:
connecting a mirror with the second side of the semiconductor pillar.

25. The method of claim 18, wherein the pillar is made of Si, Ge, InP, GaP, InAs, GaN, or GaAs.

26. The method of claim 18, wherein the excited surface states absorb photons having wavelengths ranging from ultraviolet to infrared.

27. The method of claim 18, wherein the excited surface states absorb photon having near infrared wavelengths.

28. A photodetector array comprising:

a first semiconductor wafer having a first side and a second side;

a first metal contact on the first side of the first semiconductor wafer;

two or more anisotropic tapered semiconductor pillars each having side walls, a top side and a bottom side, the top side tapered down to the bottom side;

two or more respective second metal contacts each connected with the bottom side of a respective anisotropic tapered semiconductor pillar; and a second semiconductor wafer having a third side connected with at least two of the two or more second metal contacts.

29. The photodetector array of claim 28, wherein the first side of the first semiconductor wafer is adapted to receive light in an operative condition of the photodetector array;

the received light propagates through the two or more tapered anisotropic semiconductor pillar experiencing multiple reflections from the side walls and exciting surface states of the side walls;

excited surface states absorb photons generating carriers in the two or more anisotropic tapered semiconductor pillar; and photo-current is detected by applying a voltage difference between the first metal contact and the second semiconductor wafer.

30. The photodetector array of claim 29, wherein the excited surface states absorbs photons having wavelengths ranging from ultraviolet to infrared.

31. The photodetector array of claim 29, wherein the excited surface states absorb photons having near to medium infrared wavelengths.

32. The photodetector array of claim 29, wherein the first semiconductor wafer comprises a region having N-type dopant or P-type dopant.

33. The photodetector array of claim 29, wherein the first semiconductor wafer is made of Si, Ge, InP, GaN, GaP, InAs, or GaAs and the second semiconductor wafer is made of Si, Ge, InP, GaN, GaP, InAs, or GaAs.

34. The photodetector array of claim 29, wherein the semiconductor wafer is anti-reflection coated.

35. The photodetector array of claim 29, wherein the tapered anisotropic semiconductor pillar is made of Silicon, Ge, InP, GaN, GaP, InAs, or GaAs.

36. The photodetector array of claim 28, wherein the second semiconductor wafer is bump-bonded to the two or more second metal contacts.

37. The photodetector array of claim 28, wherein the second semiconductor wafer comprises electronic circuits.

38. A method for detecting light comprising:
- providing a semiconductor pillar having a first side, a second side and side walls;
- inputting light into the semiconductor pillar through the first side;
- the side walls being configured so that the light input to the semiconductor pillar is guided from the first side of the semiconductor pillar to the second side of the semiconductor pillar, whereby surface states of the side walls are excited through interaction of reflected light with the surface states and photons are absorbed by excited surface states thereby providing carriers; and
- generating photo-current by applying a voltage difference to the first side of the semiconductor pillar and the second side of the semiconductor pillar.

39. The method of claim 38, wherein distance between the side walls is smaller than the wavelength of the light.

* * * * *